US011860109B2

(12) United States Patent
Kim et al.

(10) Patent No.: US 11,860,109 B2
(45) Date of Patent: Jan. 2, 2024

(54) OPTICAL DETECTION ELEMENT AND GOI DEVICE FOR ULTRA-SMALL ON-CHIP OPTICAL SENSING, AND MANUFACTURING METHOD OF THE SAME

(71) Applicant: Korea Advanced Institute of Science and Technology, Daejeon (KR)

(72) Inventors: Sanghyeon Kim, Daejeon (KR); Jinha Lim, Daejeon (KR); Joonsup Shim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 41 days.

(21) Appl. No.: 17/680,469

(22) Filed: Feb. 25, 2022

(65) Prior Publication Data

US 2022/0357283 A1 Nov. 10, 2022

(30) Foreign Application Priority Data

May 7, 2021 (KR) .......................... 10-2021-0058906

(51) Int. Cl.
  *G01N 21/95* (2006.01)
  *H01L 21/762* (2006.01)
  *G02B 6/122* (2006.01)

(52) U.S. Cl.
  CPC ......... *G01N 21/9501* (2013.01); *G02B 6/122* (2013.01); *H01L 21/7624* (2013.01)

(58) Field of Classification Search
  CPC ........... G01N 21/9501; G01N 21/3504; G02B 6/122; H01L 21/7624; G01J 3/108
  See application file for complete search history.

(56) References Cited

U.S. PATENT DOCUMENTS

| 10,018,530 | B2 * | 7/2018 | Santan | G01M 11/0285 |
| 11,121,270 | B2 * | 9/2021 | Kimoto | H01L 31/02167 |

(Continued)

FOREIGN PATENT DOCUMENTS

| CN | 108238581 | A | * | 7/2018 | | |
| CN | 109360806 | A | * | 2/2019 | ....... | H01L 21/76224 |

(Continued)

OTHER PUBLICATIONS

Korean Office Action issued in Korean patent application No. 10-2021-0058906, dated Jul. 28, 2022.

*Primary Examiner* — Tarifur R Chowdhury
*Assistant Examiner* — Kemaya Nguyen
(74) *Attorney, Agent, or Firm* — Faegre Drinker Biddle & Reath LLP

(57) ABSTRACT

Various embodiments relate to an optical detection element and GOI (Ge-on-insulator) device for ultra-small on-chip optical sensing, and a manufacturing method of the same. According to various embodiments, the optical detection element and the GOI device may be implemented on a GOI structure comprising a germanium (Ge) layer, and the GOI device may be implemented to have an optical detection element. Specifically, the GOI device may include a GOI structure with a waveguide region comprising a germanium layer, a light source element configured to generate light for the waveguide region, and at least one optical detection element configured to detect light coming from the waveguide region. At least one slot configured to collect light from the light source element may be formed in the germanium layer in the waveguide region. The light source element may generate light so as to be coupled to the germanium layer in the waveguide region. The optical detection element may detect heat generated as light is propagated from the germanium layer.

15 Claims, 21 Drawing Sheets

(56) References Cited

U.S. PATENT DOCUMENTS

2011/0037078 A1\* 2/2011 Lee .................. H01L 25/167
  257/E33.077
2020/0069225 A1\* 3/2020 Vizbaras ............. A61B 5/1455

FOREIGN PATENT DOCUMENTS

| JP | 10227689 A | \* | 8/1998 |
|----|------------|----|--------|
| KR | 10-2012-0108169 A | | 10/2012 |
| KR | 10-2014-0095677 A | | 8/2014 |

\* cited by examiner (a)

(b)

(a)

(b)

OPTICAL DETECTION ELEMENT AND GOI DEVICE FOR ULTRA-SMALL ON-CHIP OPTICAL SENSING, AND MANUFACTURING METHOD OF THE SAME

CROSS-REFERENCES TO RELATED APPLICATION

This application is based on and claims priority under 35 U.S.C. 119 to Korean Patent Application No. 10-2021-0058906, filed on May 7, 2021 in the Korean intellectual property office, the disclosures of which are herein incorporated by reference in its entirety.

TECHNICAL FIELD

Various embodiments relate to an optical detection element and GOI (Ge-on-insulator) device for ultra-small on-chip optical sensing, and a manufacturing method of the same.

BACKGROUND OF THE INVENTION

Optical sensing is being applied in various fields of sensing. Recently, research is being conducted to detect gases or biomaterials using mid-infrared light. However, the main drawbacks of existing sensing equipment are that they are bulky and expensive, because they require enough optical paths to use mid-infrared light. Meanwhile, on-chip optical sensing devices with a silicon-based waveguide are in use. Such optical sensing devices use near-infrared light due to their relatively low field confinement capability, but there are quite a few limitations in terms of using mid-infrared spectra. Thus, there is demand for optical sensing devices that meet all of the various requirements.

SUMMARY

Various embodiments provide an optical detection element and GOI (Ge-on-insulator) device for ultra-small on-chip optical sensing, and a manufacturing method of the same.

Various embodiments provide an optical detection element and GOI device for optical sensing using mid-infrared light, and a manufacturing method of the same.

A GOI device according to various embodiments may include: a GOI structure with a waveguide region comprising a germanium (Ge) layer; a light source element configured to generate light for the waveguide region; and at least one optical detection element configured to detect light coming from the waveguide region.

A manufacturing method of a GOI device according to various embodiments may include: manufacturing a GOI structure comprising a germanium layer and provided with a waveguide region; integrating, on the GOI structure, a light source element configured to generate light for the waveguide region; and integrating, on the GOI structure, at least one optical detection element configured to detect light coming from the waveguide region.

According to various embodiments, the manufacturing of a GOI structure may include: preparing an epitaxial wafer with a germanium layer grown on a bottom layer; forming an oxide layer on the germanium layer; bonding the epitaxial wafer onto the insulating substrate through the oxide layer; and removing the bottom layer while leaving the germanium layer on the insulating substrate.

The optical detection element according to various embodiments may include: a GOI structure comprising a germanium layer configured to propagate light from the outside; and a bolometric material layer disposed on the GOI structure, whose resistance changes with heat generated as light is propagated from the germanium layer; and configured to detect the resistance after a change in resistance has occurred.

According to various embodiments, the optical detection element and the GOI device are implemented on a germanium-based GOI structure, and therefore the optical detection element and the GOI device may be implemented in an ultra-small on-chip structure and used for optical sensing. In this instance, the GOI structure may ensure relatively high field confinement capability through germanium. Thus, the optical detection element and the GOI device may be used for optical sensing over a broad band including mid-infrared light. Also, the optical detection element may detect light by detecting heat into which light is converted, thereby maximizing the extensibility of optical sensing.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Hereinafter, various embodiments of this disclosure will be described with reference to the accompanying drawings.

Figure 1:
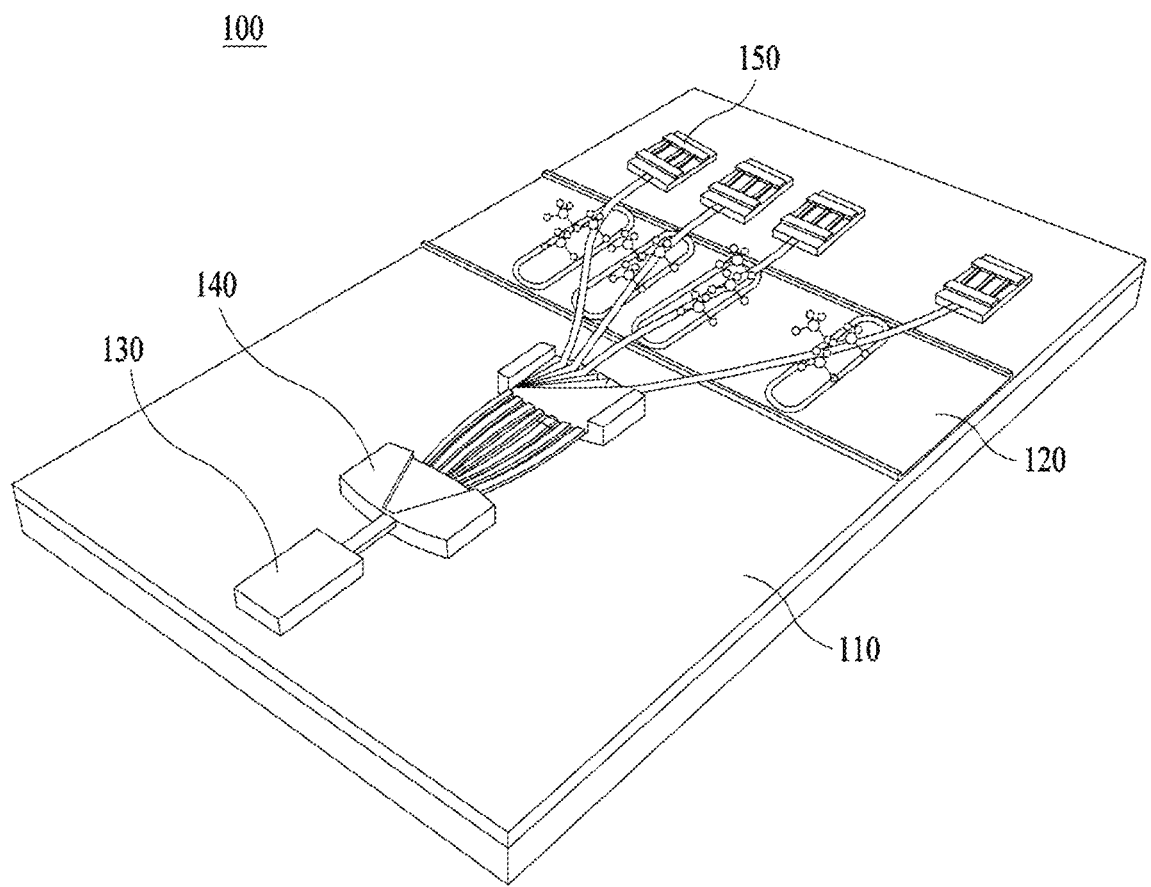
FIG. 1 is a perspective view schematically illustrating a GOI device according to various embodiments.
Figure 2:
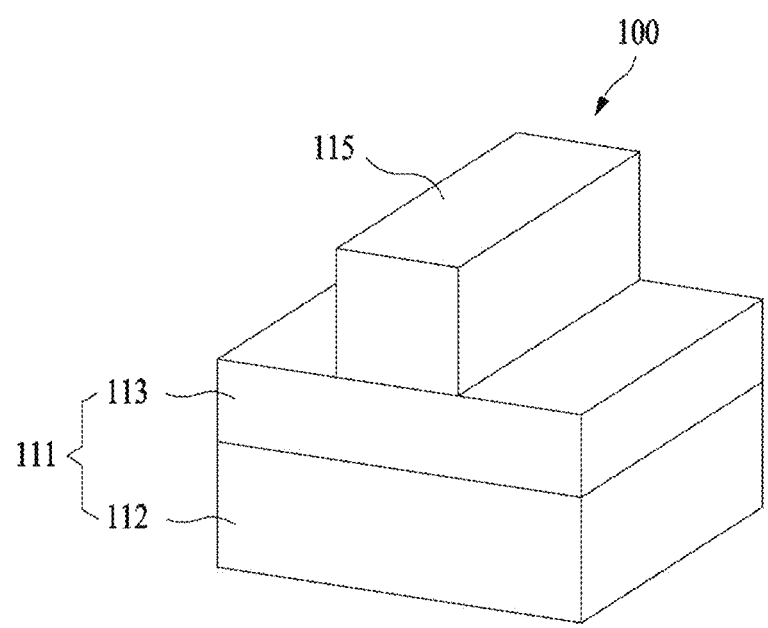
FIG. 2 is a perspective view schematically illustrating a GOI structure of FIG. 1.
Figure 3:
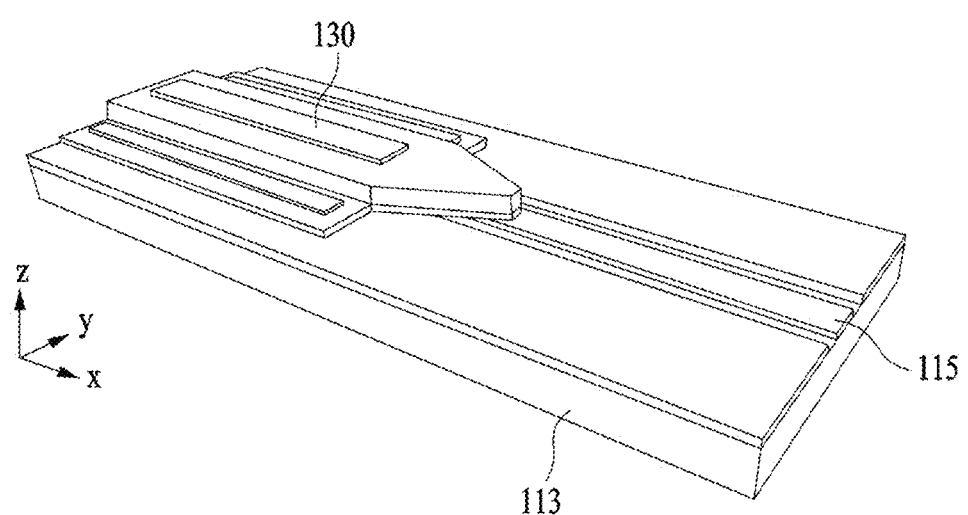
FIG. 3 is a perspective view exemplifying a light source element of FIG. 1.
Figure 4A:
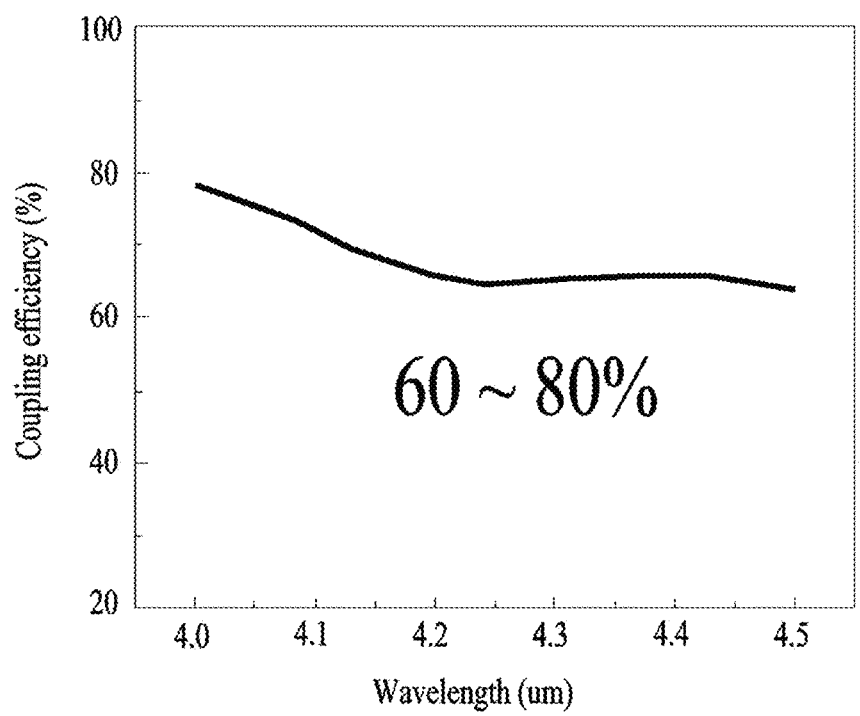
FIGS. 4A and 4B are views for explaining the performance of the light source element of FIG. 3.
Figure 4B:
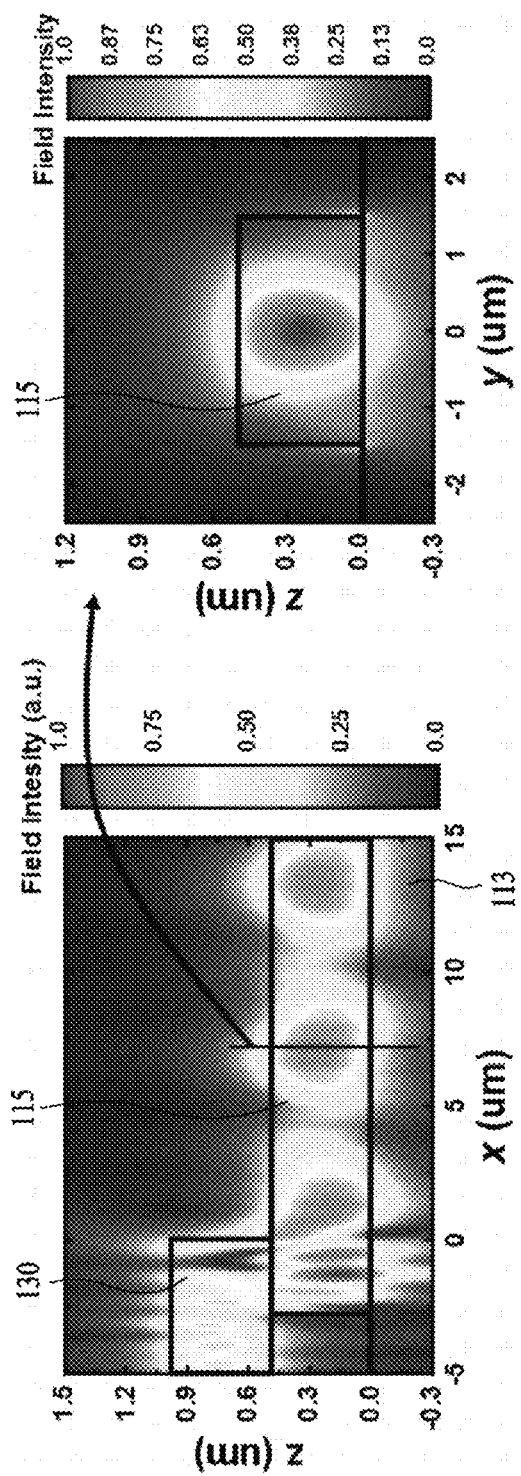
Figure 5:
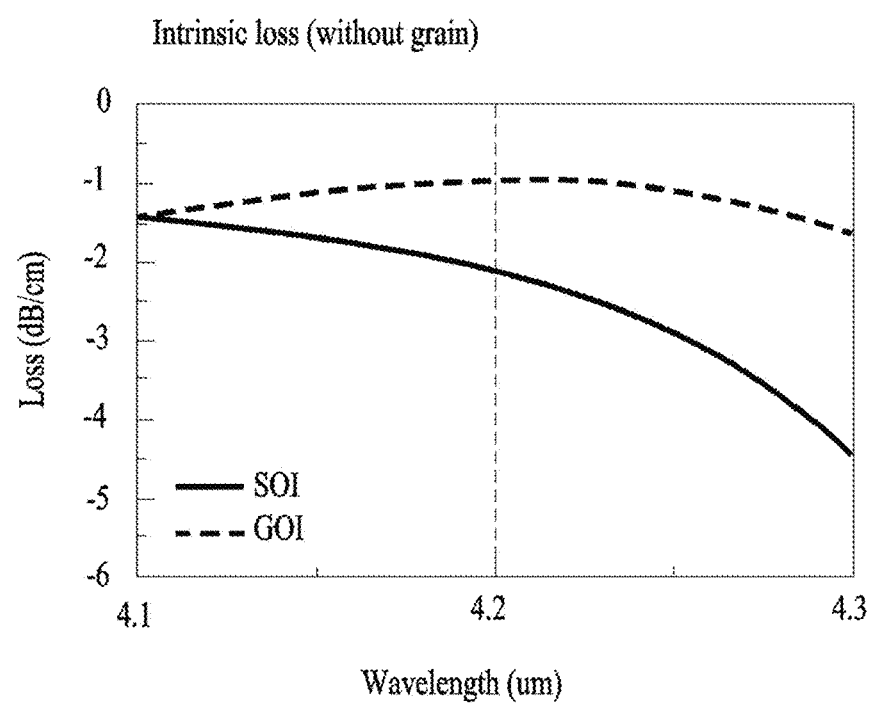
FIGS. 5, 6A and 6B are views for explaining the performance of a waveguide region of FIG. 1.
Figure 6A:
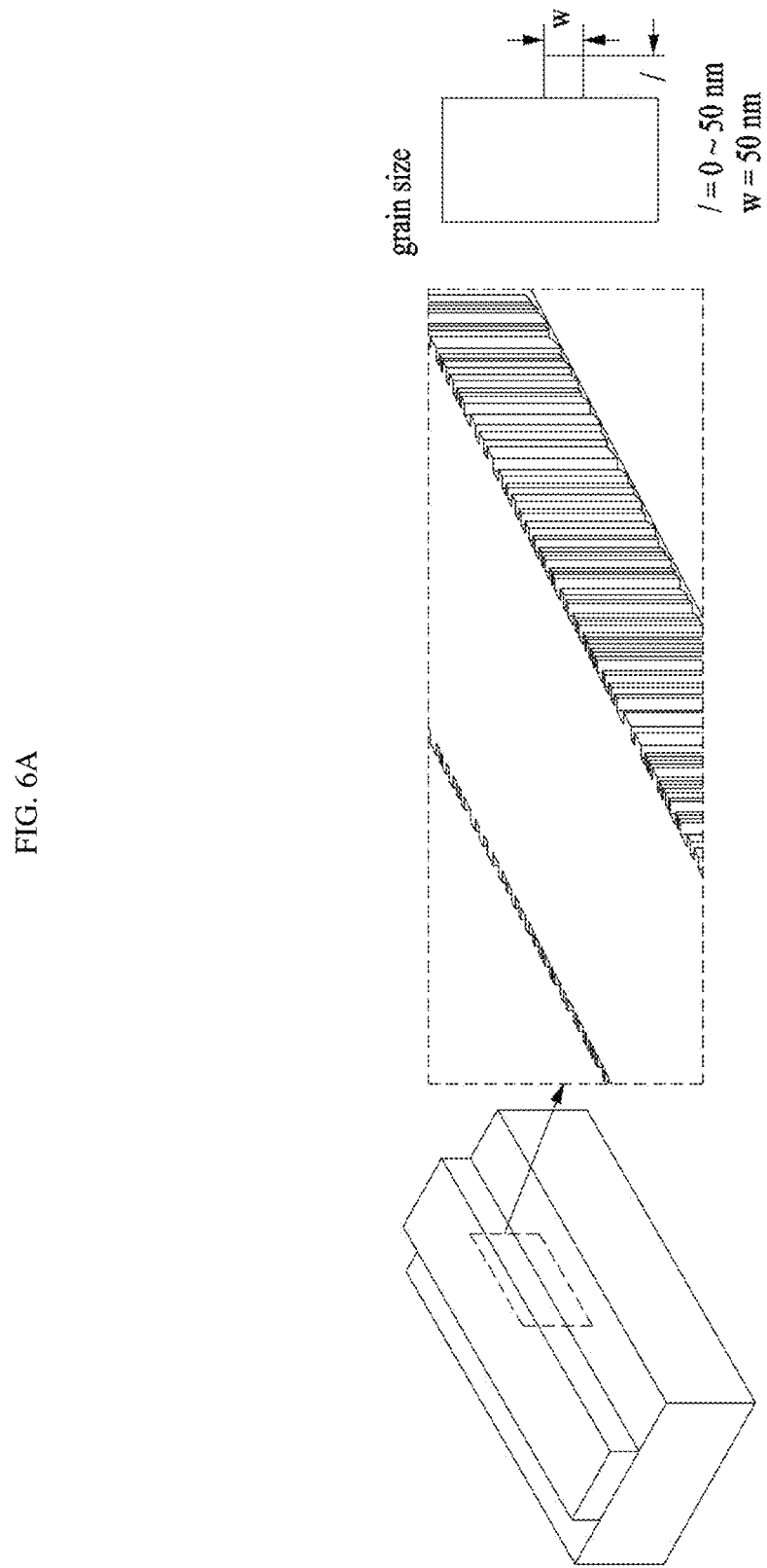
Figure 6B:
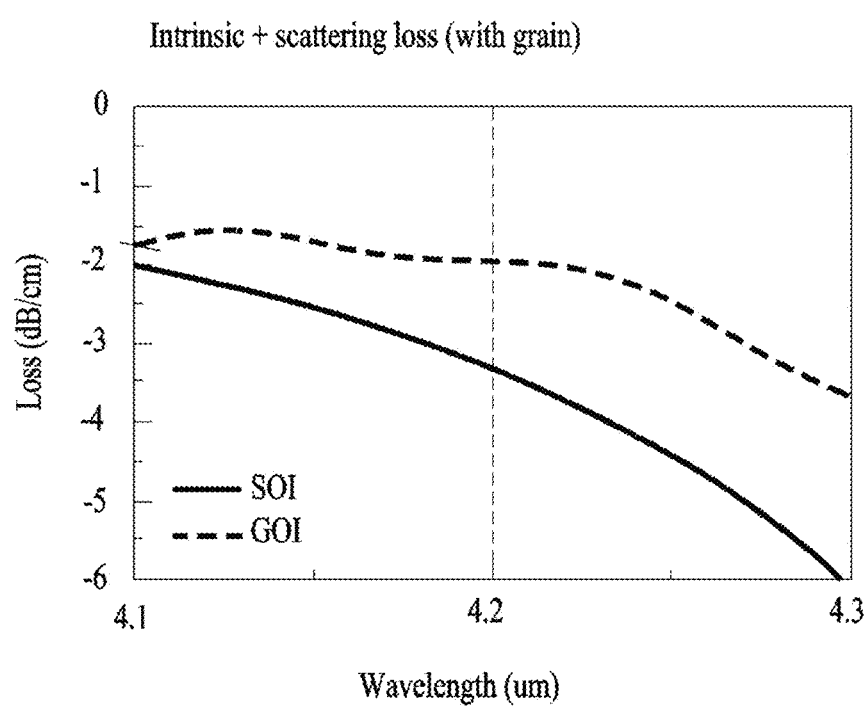
Figure 7:
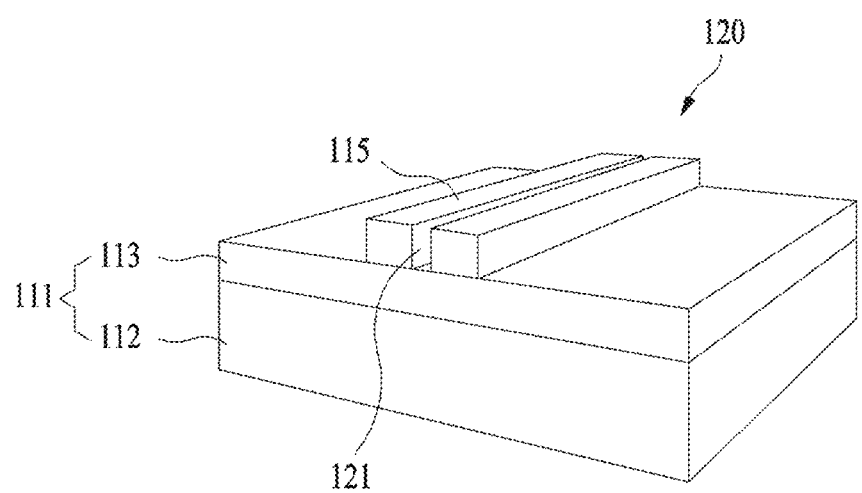
FIG. 7 is a perspective view schematically illustrating the waveguide region of FIG. 1.
Figure 8:
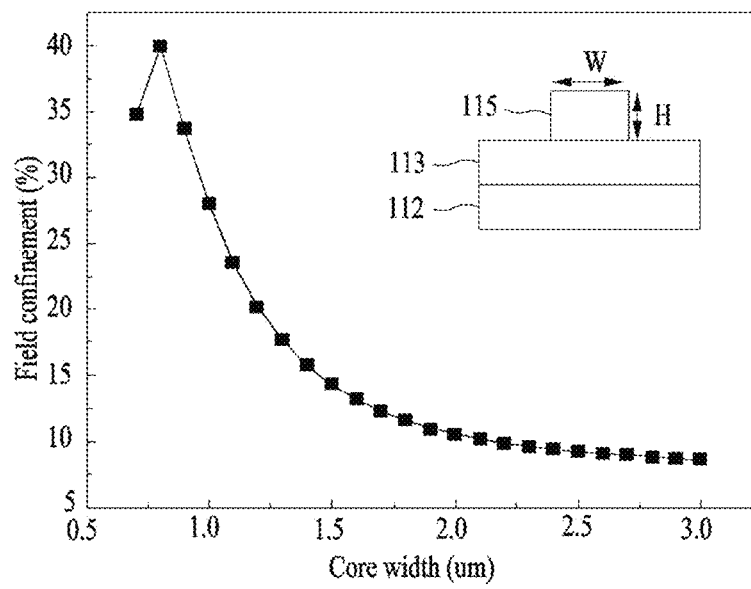
FIGS. 8 and 9 are views for explaining the performance of the waveguide region of FIG. 7.
Figure 8:
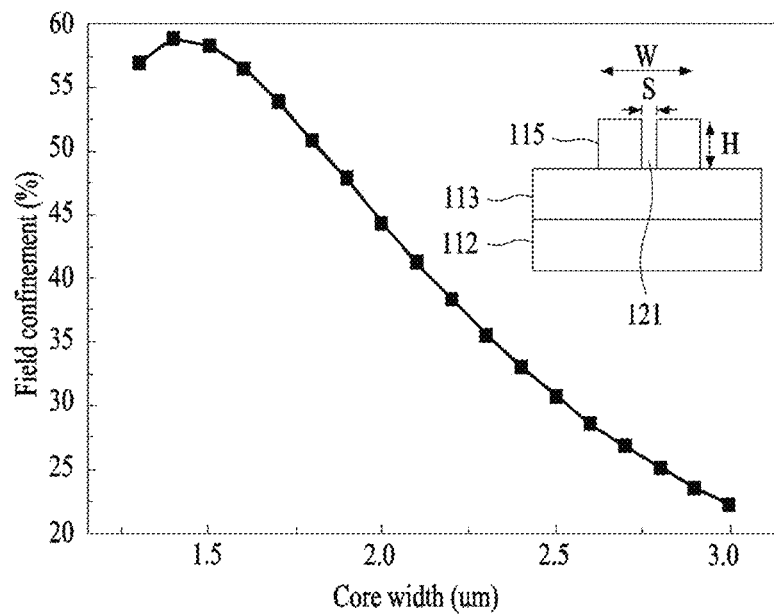
Figure 9:
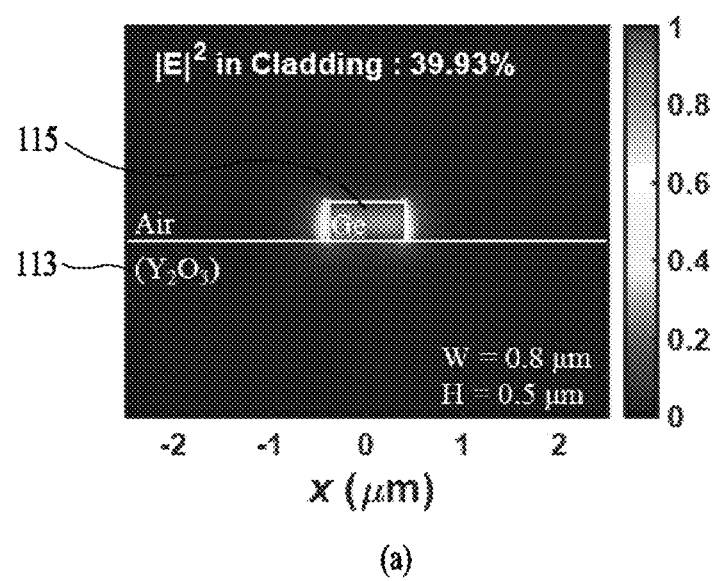
Figure 9:
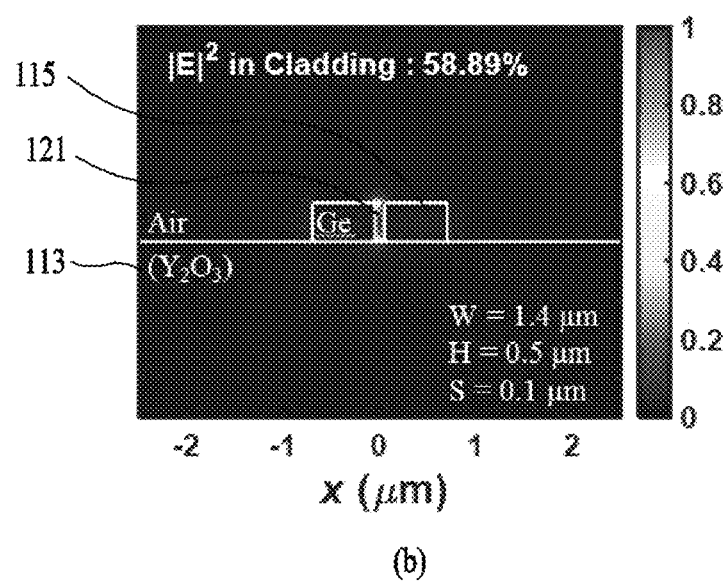
Figure 10:
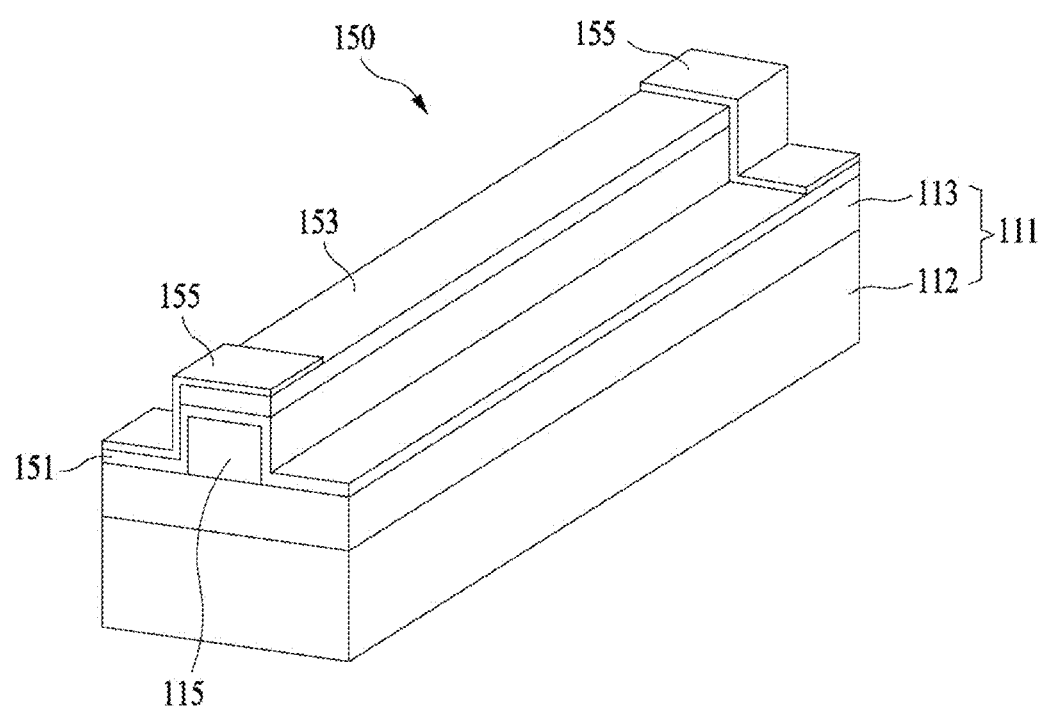
FIG. 10 is a perspective view schematically illustrating an optical detection element of FIG. 1.
Figure 11:
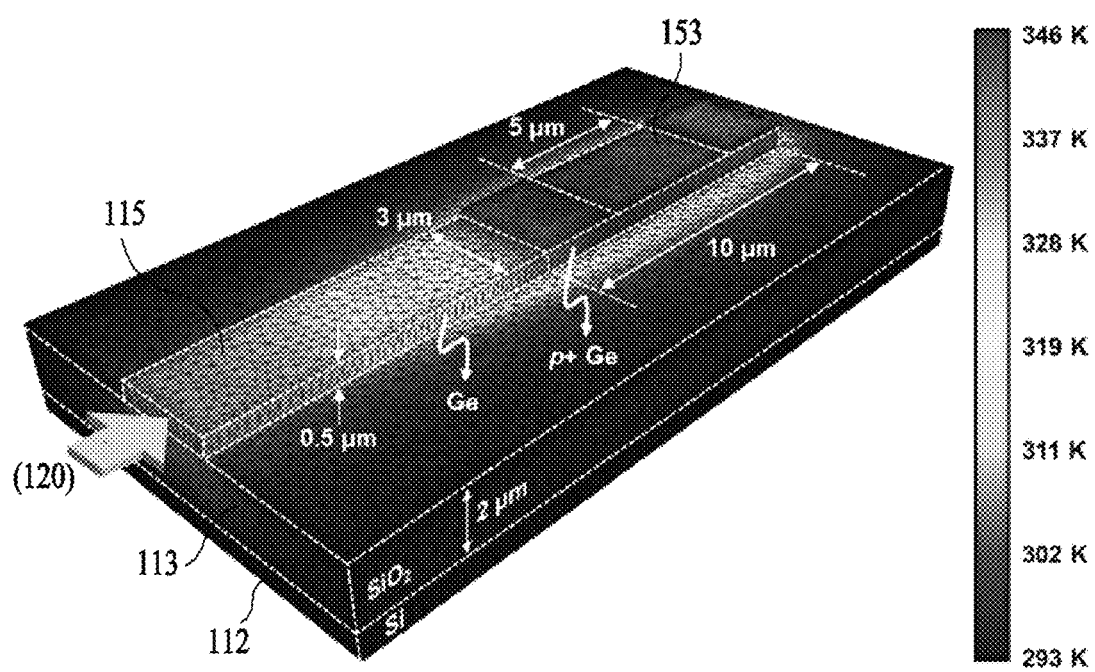
FIG. 11 is a view for explaining the performance of the optical detection element of FIG. 10.

FIG. 1 is a perspective view schematically illustrating a GOI device 100 according to various embodiments. FIG. 2 is a perspective view schematically illustrating a GOI structure 110 of FIG. 1. FIG. 3 is a perspective view exemplifying a light source element 130 of FIG. 1. FIGS. 4A and 4B are views for explaining the performance of the light source element 130 of FIG. 3. FIGS. 5, 6A and 6B are views for explaining the performance of a waveguide region 120 of FIG. 1. FIG. 7 is a perspective view schematically illustrating the waveguide region 120 of FIG. 1. FIGS. 8 and 9 are views for explaining the performance of the waveguide region 120 of FIG. 7. FIG. 10 is a perspective view schematically illustrating an optical detection element 150 of FIG. 1. FIG. 11 is a view for explaining the performance of the optical detection element 150 of FIG. 10.

Referring to FIG. 1, the GOI device 100 is for ultra-small on-chip optical sensing, and may include at least one of a GOI structure 110, a light source element 130, a spectrometer 140, or at least one optical detection element 150. In this instance, the GOI device 100 may detect gases by measuring optical absorption spectra of gases on mid-infrared light (mid-IR). Here, the mid-infrared light may represent infrared light in the wavelength range of 3 µm to 8 µm and the frequency range of 38 THz to 100 THz.

The GOI structure 110 may be constructed as a platform for ultra-small on-chip optical sensing. The GOI structure 110 may support at least one of the light source element 130, the spectrometer 140, or the optical detection element 150. Also, the GOI structure 110 may be implemented to propagate light generated from the light source element 130. To this end, the GOI structure 110 may have a waveguide region 120. That is, some part of the GOI structure 110 may be formed as the waveguide region 120.

As illustrated in FIG. 2, the GOI structure 110 may include an insulating substrate 111 and a germanium (Ge) layer 115. The insulating substrate 111 may support the germanium layer 115. In this instance, the insulating substrate 111 may include a base layer 112, and an oxide layer 113 stacked on top of the base layer 112. For example, the base layer 112 may be made of silicon (Si). The germanium layer 115 may be disposed on the insulating substrate 111, specifically, on the oxide layer 113, and may be made of germanium (Ge).

The light source element 130 may be configured to generate light for the waveguide region 120. To this end, the light source element 130 may be disposed on one side of the waveguide region 120. Here, the light source element 130 may be integrated on the GOI structure 110 and disposed on one side of the waveguide region 120. In this instance, the light source element 130 may generate mid-infrared light. The light source element 130 may generate light so as to be coupled to the germanium layer 115 in the waveguide region 120.

For example, the light source element may include a quantum cascade laser (QCL) as illustrated in FIG. 3. The quantum cascade laser may produce infrared light with an output power of several tens of mW to several hundreds of mW. Here, the coupling efficiency versus wavelength of mid-infrared light from the quantum cascade laser to the germanium layer 115 may be high that is around 60% to 80%, as illustrated in FIG. 4A. Also, the mid-infrared light coupled to the germanium layer 115 from the quantum cascade laser may exhibit a field distribution as illustrated in FIG. 4B.

The spectrometer 140 may be configured to obtain a spectrum of light from the light source element 130. To this end, the spectrometer 140 may be disposed between the light source element 130 and the waveguide region 120. Here, the spectrometer 140 may be integrated on the GOI structure 110 and disposed between the light source element 130 and the waveguide region 120. Also, the spectrometer 140 may decompose the light from the light source element 130 by wavelength and propagate it to the waveguide region 120.

Through this, the germanium layer 115 of the waveguide region 120 may propagate the light from the light source element 130 while confining it. In this instance, due to the material properties of the germanium layer 115, the waveguide region 120 with the germanium layer 115 may be better than the existing silicon-based waveguide, in terms of propagation loss, as illustrated in FIGS. 5, 6A and 6B. That is, as illustrated in FIG. 5, the waveguide region 120 with the germanium layer 115 might be better than the existing silicon-based waveguide, in terms of propagation loss caused by the material properties. Moreover, given the uneven shape of sidewalls due to grains as illustrated in FIG. 6A, the waveguide region 120 with the germanium layer 115 may be better than the existing silicon-based waveguide in terms of propagation loss caused by the material properties and propagation loss caused by the uneven shape of sidewalls, as illustrated in FIG. 6B. Meanwhile, because the germanium layer 115 has high field confinement capability, the waveguide region 120 with the germanium layer 115 may confine light with higher field confinement capability than the existing silicon-based waveguide. In some embodiments, the germanium layer 115 of the waveguide region 120 may have at least one slot 121, as illustrated in FIG. 7. The slot 121 may be configured in such a way as to collect and propagate the light from the light source element 130. Due to this, as illustrated in FIG. 8 and FIG. 9, the germanium layer 115 (in FIG. 8 and (b) of FIG. 9) with the slot 121 may confine light with higher field confinement capability than the germanium layer 115 (in FIG. 8 and (a) of FIG. 9) with no slot 121.

At least one optical detection element 150 may be configured to detect light coming from the waveguide region 120. In some embodiments, a plurality of optical detection elements 150 may be formed in an array. In some embodiments, the optical detection element 150 may convert the light from the waveguide region 120 into heat and detect the heat. The optical detection element 150 may be implemented to detect heat and therefore detect light, which makes it easy to accomplish advantages such as wavelength independence and room temperature operation, compared to existing photon detection elements which directly detect light, and which furthermore maximizes the extensibility of optical sensing. To this end, the optical detection element 150 may be disposed on one side of the waveguide region 120, that is, on the opposite side of the light source element 130, with the waveguide region 120 in between. In this case, the optical detection element 150 may be integrated on the GOI structure 110 and implemented to be integrated with some part of the GOI structure 110. As such, the optical detection element 140 may detect heat that is generated as light is propagated from a heavily-doped germanium layer 115 of the GOI structure 110, and, as a result, may detect light based on the heat.

According to an embodiment, the optical detection element 150 may be a bolometer, which is a type of thermal detector, for detecting heat, and may be implemented using a waveguide-based bolometer structure, in particular. For example, the optical detection element 150 may include an insulating layer 151, a bolometric material layer 153, and at least one electrode 155, as illustrated in FIG. 10.

The insulating layer 151 may prevent electrical connection between the heavily-doped germanium layer 115 and the bolometric material layer 153. To this end, the insulating layer 151 may be formed on one side of the waveguide region 120 so as to cover the heavily-doped germanium layer 115 on the insulating substrate 111. For example, the insulating layer 151 may be made of oxide.

The heavily-doped germanium layer 115 may convert the light from the waveguide region 120 into heat. In this instance, the heavily-doped germanium layer 115 may absorb the light propagated from the heavily-doped germanium layer 115 by a free-carrier absorption (FCA) effect, and therefore the heat generated from the heavily-doped germanium layer 115 may be transmitted to the bolometric material layer 153, causing a change in the resistance of the bolometric material layer 153. To this end, the bolometric material layer 153 may be stacked on top of the insulating layer 151. In other words, the bolometric material layer 153 may be stacked on top of the heavily-doped germanium layer 115, with the insulating layer 151 in between. For example, the bolometric material layer 153 may be made of a bolometric material such as vanadium oxide, titanium oxide, amorphous silicon, and silicon germanium oxide. Here, the bolometric material layer 153 may exhibit heat generation efficiency as illustrated in FIG. 11. For example, if light with a wavelength of 4.23 µm and an intensity of 10 mW enters the heavily-doped germanium layer 115 of the optical detection element 150 with such design variables as illustrated in FIG. 11 from the waveguide region 120, the bolometric material layer 153 may generate heat with a thermal efficiency of about 9.312 K/mW.

The electrode 155 may be used to detect a change in the resistance of the bolometric material layer 153. To this end, the electrode 155 may be integrated on the bolometric material layer 153. In this instance, heat may be detected from the detected resistance, and furthermore light may be detected.

According to various embodiments, the GOI device 100 may be used to detect gases. For example, the GOI device 100 may detect carbon dioxide ($CO_2$) using mid-infrared light. In this instance, the limit of detection (LoD) of the GOI device 100 may be calculated by the following [Equation 1]. That is, the limit of detection of the GOI device 100 may have a high correlation with the noise equivalent temperature difference (NETD) in the bolometric material layer 153 of the optical detection element 150. Accordingly, the noise equivalent temperature difference (NETD) in the bolometric material layer 153 of the optical detection element 150 may be improved, thereby greatly enhancing the performances of the optical detection element 150 and the GOI device 100.

$$C_{min} = \frac{-\ln\left(1 - \frac{P_{min}}{P_0 e^{-\alpha_{prop} L}}\right)}{\eta \varepsilon_{gas} L}$$ [Equation 1]

$$P_{min} = SNR \times \frac{NETD(K)}{\text{Thermal efficiency}(K/W)}$$

where C is the concentration (mol·L$^{-1}$) of a gas, $C_{min}$ is the minimum concentration (mol·L$^{-1}$) of the gas, $P_{min}$ is minimum detectable power (W), η is a confinement factor (%), $\varepsilon_{gas}$ is molar absorption coefficient (mol·L$^{-1}$·cm), L is the length (cm) of an optical path, $P_0$ is the intensity (W) of incoming light, and $\alpha_{prop}$ is optical loss (cm$^{-1}$). For example, if η is 58.89%, $P_0$ is 10 mW, $\alpha_{prop}$ is 1.97 dB/cm (0.4536 cm$^{-1}$), L is 1.396 cm, $\varepsilon_{gas}$ is 9200 mol·L$^{-1}$·cm, the SNR (signal-to-noise ratio) is 3, the thermal efficiency is 9.312 K/mW, and the noise equivalent temperature difference (NETD) is 11.64 mK, $C_{min}$ will be 1.1507×10$^{-7}$ mol/L, and the limit of detection of the GOI device 100 will be about 2.25 ppm (the background temperature is assumed to be 20° C.).

Figure 12:
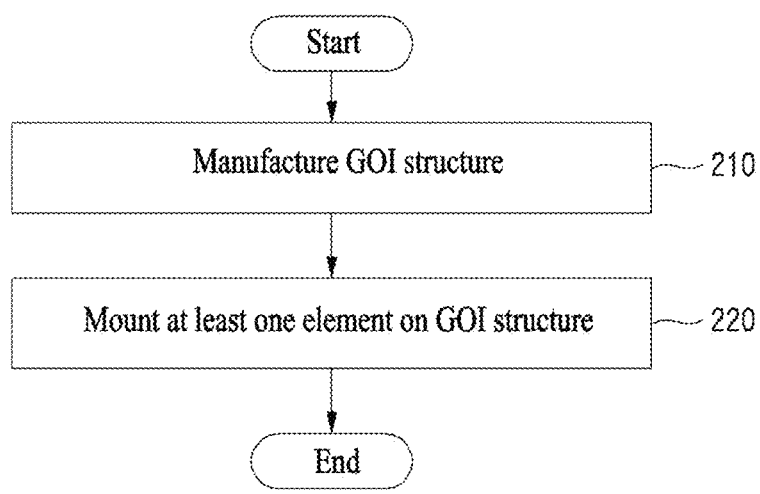
FIG. 12 is a flowchart illustrating a manufacturing method of a GOI device according to various embodiments.

FIG. 12 is a flowchart illustrating a manufacturing method of a GOI device 100 according to various embodiments. FIGS. 13a through 13g are perspective views for explaining in details manufacturing steps of a GOI structure 110 of FIG. 12.

Referring to FIG. 12, in the step 210, the GOI structure 110 may be manufactured. The GOI structure 110 may be constructed as a platform for for ultra-small on-chip optical sensing. As illustrated in FIG. 2, the GOI structure 110 may include an insulating substrate 111 and a germanium layer 115. Here, the insulating substrate 111 may include a base layer 112, and an oxide layer 113 stacked on top of the base layer 112. Also, the GOI structure 110 may have a waveguide region 120. That is, some part of the GOI structure 110 may be formed as the waveguide region 120. A manufacturing procedure of the GOI structure 110 will be described below in more details with reference to FIGS. 13A through 13G.

Figure 13A:
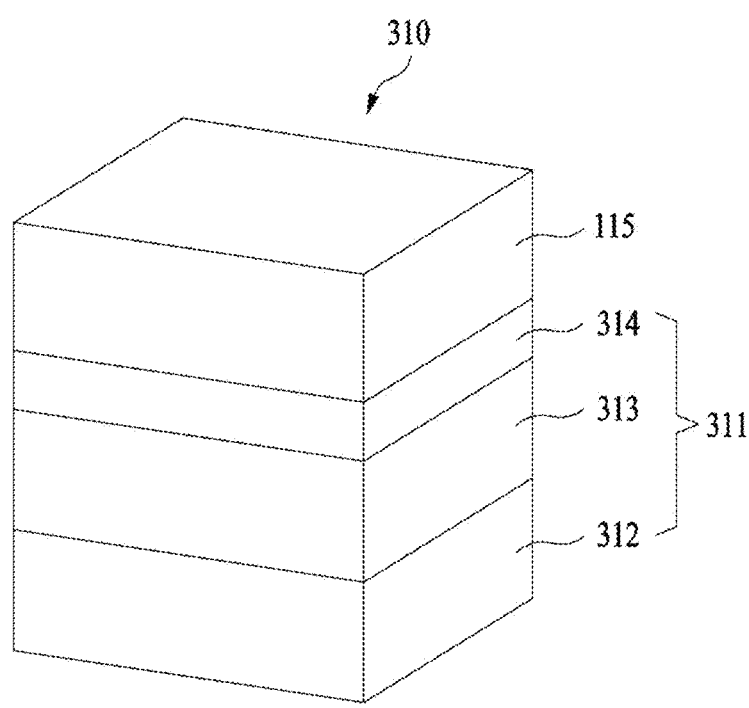
FIGS. 13A through 13G are perspective views for explaining in details manufacturing steps of a GOI structure of FIG. 12.
Figure 13B:
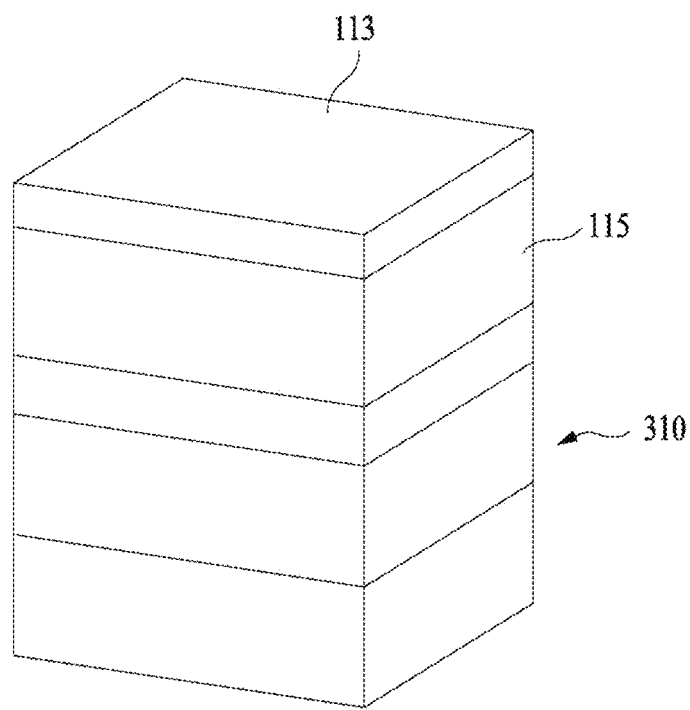

First of all, as illustrated in FIG. 13A, an epitaxial wafer 310 may be prepared. The epitaxial wafer 310 may include a bottom layer 311 and a germanium layer 115 on the bottom layer 311. That is, the epitaxial wafer 310 may be prepared as the germanium layer 115 grows on the bottom layer 311. For example, the bottom layer 311 may include a support layer 312, a strain-relaxed buffer layer 313, and a base growth layer 314. The support layer 312 may support the strain-relaxed buffer layer 313 and the base growth layer 314. For example, the support layer 312 may be made of silicon. The strain-relaxed layer 313 may be disposed on the support layer 312. In this instance, the strain-relaxed layer 313 may be a lattice mismatch with respect to the germanium layer 115. In other words, the lattice constant of the strain-relaxed layer 313 may be different from the lattice constant of the germanium layer 115. As such, strain may be applied to the germanium layer 115 through the strain-relaxed layer 313. The base growth layer 314 may be disposed on the strain-relaxed layer 313. For example, the base growth layer 314 may be made of silicon and germanium. The germanium layer 115 may be disposed on the base growth layer 314. Afterwards, as illustrated in FIG. 13B, an oxide layer 113 may be formed on the epitaxial wafer 310. In this instance, the oxide layer 113 may be formed on the germanium layer 115.

Figure 13C:
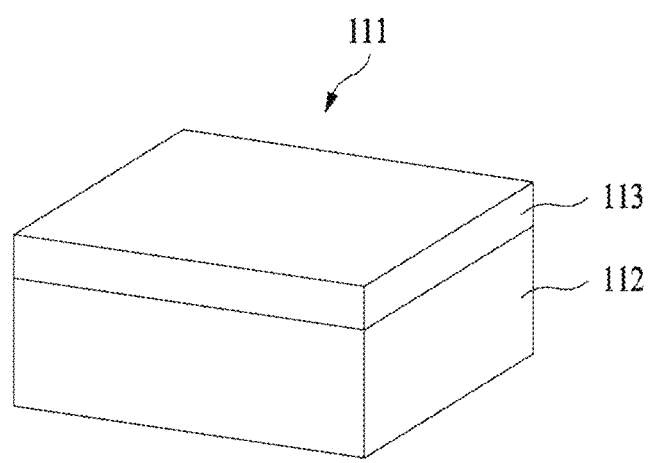

Meanwhile, as illustrated in FIG. 13C, an insulating substrate 111 may be prepared. In this instance, the insulating substrate 111 may include a base layer 112 and an oxide layer 113 stacked on top of the base layer 112. For example, the base layer 112 may be made of silicon.

Figure 13D:
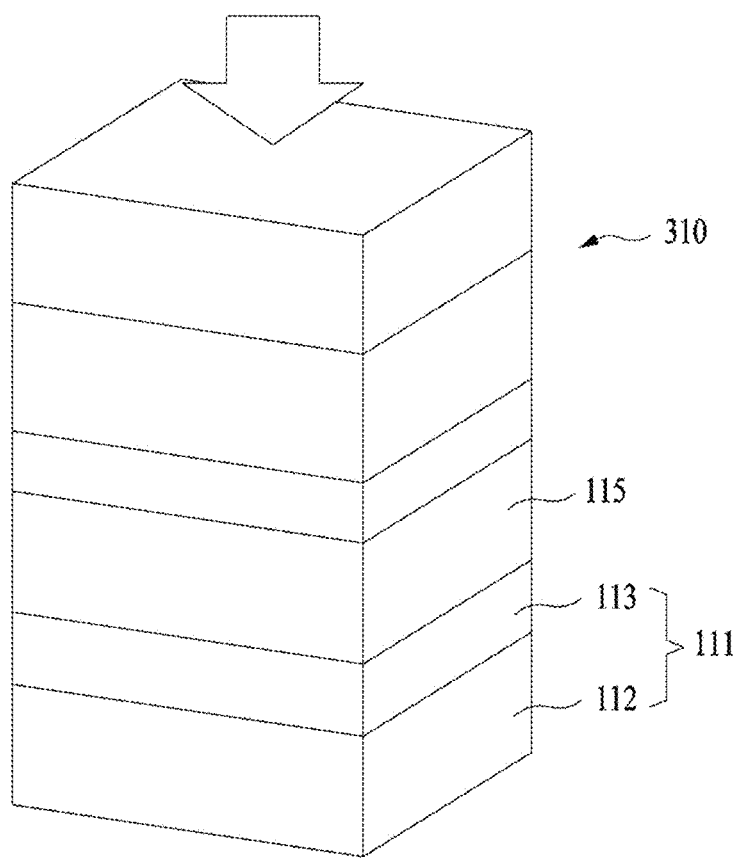
Figure 13E:
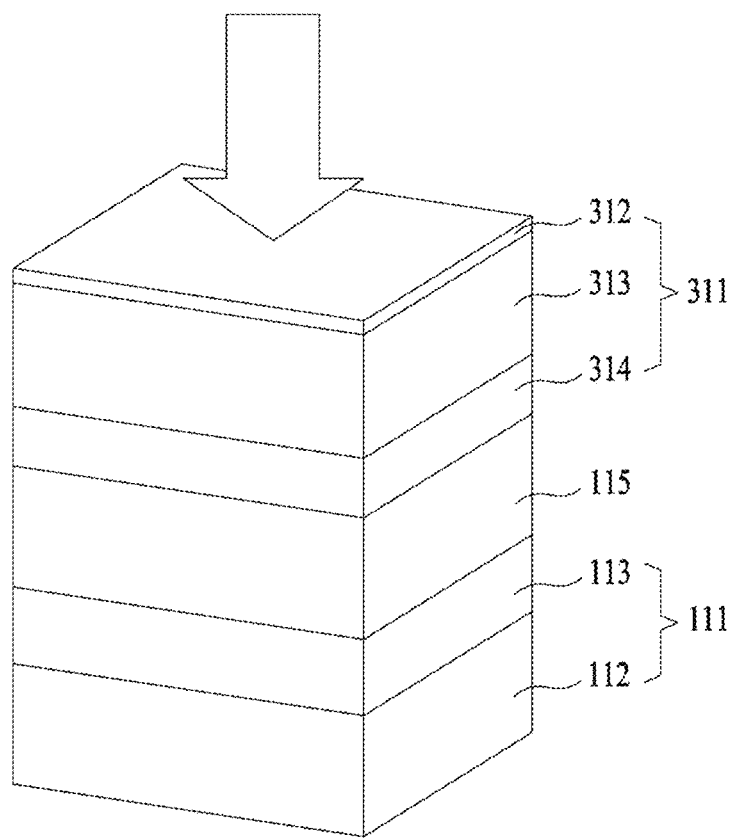

Next, as illustrated in FIG. 13D, the epitaxial wafer 310 may be bonded onto the insulating substrate 111 through the oxide layer 113. In this instance, the oxide layer 113 on the epitaxial wafer 310 may be bonded to the oxide layer 113 on the insulating substrate 111, and be therefore integrated with the insulating substrate 111. Thus, the germanium layer 115 may be disposed on the insulating substrate 111. Afterwards, as illustrated in FIG. 13E, the bottom layer 311 may be removed. In this instance, the base growth layer 314, the strain-relaxed layer 313, and the support layer 312 may be removed at the same time or sequentially. Here, the bottom layer 311 may be removed by at least one of a chemical technique and a mechanical technique. According to one embodiment, the bottom layer 311 may be chemically removed by using at least one tetramethylammonium hydroxide (TMAH) and SC-1 (e.g., $NH_4OH+H_2O_2+H_2O$ solution). According to another embodiment, the bottom layer 311 may be mechanically removed by at least one of a grinding technique or a polishing technique.

Figure 13F:
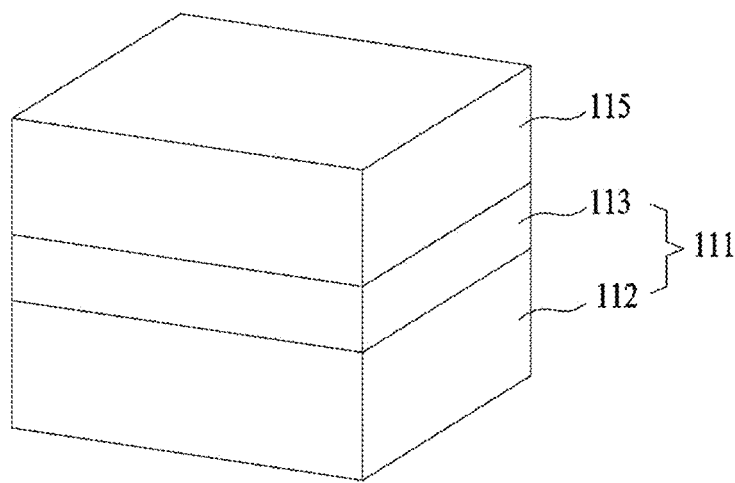
Figure 13G:
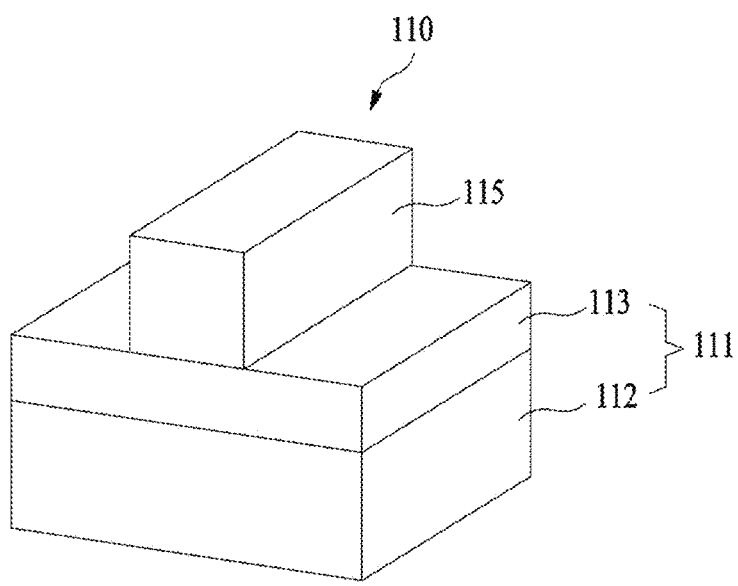

Thus, as illustrated in FIG. 13F, only the germanium layer 115 may remain on the insulating substrate 111. Afterwards, as illustrated in FIG. 13G, the germanium layer 115 on the insulating substrate 111 may be processed. In this instance, part of the germanium layer 115 may be removed. Consequently, the GOI structure 110 may be manufactured. In some embodiments, in the waveguide region 120 of the GOI structure 110, at least one slot 121 may be additionally generated in the germanium layer 115.

Next, in the step 220, at least one element 130, 140, and 150 may be integrated on the GOI structure 110. In this instance, the element 130, 140, and 150 may include at least one of a light source element 130, a spectrometer 140, or at least one optical detection element 150. Accordingly, the GOI device 100 as illustrated in FIG. 1 may be manufactured.

The light source element 130 may be configured to generate light for the waveguide region 120. To this end, the light source element 130 may be disposed on one side of the waveguide region 120. Here, the light source element 130 may be integrated on the GOI structure 110 and disposed on one side of the waveguide region 120. In this instance, the light source element 130 may generate mid-infrared light. The light source element 130 may generate light so as to be coupled to the germanium layer 115 of the waveguide region 120.

The spectrometer 140 may be configured to obtain a spectrum of light from the light source element 130. To this end, the spectrometer 140 may be disposed between the light source element 130 and the waveguide region 120. Here, the spectrometer 140 may be integrated on the GOI structure 110 and disposed between the light source element 130 and the waveguide region 120. Also, the spectrometer 140 may decompose the light from the light source element 130 by wavelength and propagate it to the waveguide region 120.

The optical detection element 150 may be configured to detect light coming from the waveguide region 120. In some embodiments, a plurality of optical detection elements 150 may be formed in an array. In some embodiments, the optical detection element 150 may convert the light from the waveguide region 120 into heat and detect the heat. To this end, the optical detection element 150 may be disposed on one side of the waveguide region 120, that is, on the opposite side of the light source element 130, with the waveguide region 120 in between. In this case, the optical detection element 150 may be integrated on the GOI structure 110 and implemented to be integrated with some part of the GOI structure 110. As such, the optical detection element 140 may detect heat, which is generated as light is propagated from a heavily-doped germanium layer 115 of the GOI structure 110, and as a result detect light based on the heat. That is, the optical detection element 150 may be implemented on the GOI structure 110 through monolithic integration. Thus, an additional component for absorbing light from the waveguide region 120, for example, a nanostructure, may not be needed to implement the optical detection element 150. Consequently, the optical detection element 150 may detect heat that is generated as light is propagated from the germanium layer 115 of the GOI structure 110, and, as a result, may detect light based on the heat.

According to an embodiment, the optical detection element 150 may be a bolometer for detecting heat. For example, the optical detection element 150 may include an insulating layer 151, a bolometric material layer 153, and at least one electrode 155, as illustrated in FIG. 10. A manufacturing procedure of this optical detection element 150 is as follows.

First of all, the insulating layer 151 may be formed to cover the germanium layer 115 on the insulating substrate 111, on one side of the waveguide region 120. For example, the insulating layer 151 may be made of oxide. Afterwards, the bolometric material layer 153 may be stacked on the insulating layer 151. In other words, the bolometric material layer 153 may be stacked on top of the germanium layer 115, with the insulating layer 151 in between. For example, the bolometric material layer 153 may be made of a bolometric material such as vanadium oxide, titanium oxide, amorphous silicon, and silicon germanium oxide. Next, at least one electrode 155 may be formed on the bolometric material layer 153.

According to various embodiments, the optical detection element 150 and the GOI device 100 are implemented on a germanium-based GOI structure 110, and therefore the optical detection element 150 and the GOI device 100 may be implemented in an ultra-small on-chip structure and used for optical sensing. In this instance, the GOI structure 110 may ensure relatively high field confinement capability through germanium. Thus, the optical detection element 150 and the GOI device 100 may be used for optical sensing over a broad band including mid-infrared light. Also, the optical detection element 150 may detect light by detecting heat into which the light is converted, thereby maximizing the extensibility of optical sensing.

Various embodiments may provide an optical detection element 150 and GOI (Ge-on-insulator) device 100 for ultra-small on-chip optical sensing, and a manufacturing method of the same.

The GOI device 100 according to various embodiments may include: a GOI structure 110 with a waveguide region 120 comprising a germanium layer 115; a light source element 130 configured to generate light for the waveguide region 120; and at least one optical detection element 150 configured to detect light coming from the waveguide region 120.

According to various embodiments, the light generated from the light source element 130 may be mid-infrared light.

According to various embodiments, at least one slot 121 configured to collect light from the light source element 130 may be formed in the germanium layer 115 in the waveguide region 120.

According to various embodiments, the light source element 130 may generate light so as to be coupled to the germanium layer 115 in the waveguide region 120.

According to various embodiments, the optical detection element 150 may be configured to convert the light from the waveguide region 120 into heat and detect the heat.

According to various embodiments, the GOI structure 110 may include an insulating substrate 111 and a germanium layer 115 integrated on the insulating substrate 111. Some part of the GOI structure 110 may be formed as the waveguide region 120.

According to various embodiments, the optical detection element 150 may include: an insulating layer 151 integrated on one side of the waveguide region 120 on the GOI structure 110 and formed to cover the germanium layer 115 on the insulating substrate 111; a bolometric material layer 153 stacked on top of the insulating layer 151, whose resistance changes with heat generated as light is propagated from the germanium layer 115; and at least one electrode 155 integrated on the bolometric material layer 153 and used to detect the resistance after a change in resistance has occurred.

According to various embodiments, the GOI device 100 may further include a spectrometer 140 disposed between the light source element 130 and the waveguide region 120 and configured to decompose the light from the light source element 130 by wavelength and propagate it to the waveguide region 120.

A manufacturing method of the GOI device 100 according to various embodiments may include: a step 210 of manufacturing a GOI structure 110 comprising a germanium layer 115 and provided with a waveguide region 120, a step 220 of integrating, on the GOI structure 110, a light source element 130 configured to generate light for the waveguide region 120; and a step 220 of integrating, on the GOI structure 110, at least one optical detection element 150 configured to detect light coming from the waveguide region 120.

According to various embodiments, the step 210 of manufacturing a GOI structure 110 may include: preparing an epitaxial wafer 310 with a germanium layer 115 grown on a bottom layer 311; forming an oxide layer 113 on the germanium layer 115; bonding the epitaxial wafer 310 onto the insulating substrate 111 through the oxide layer 113; and removing the bottom layer 311 while leaving the germanium layer 115 on the insulating substrate 111.

According to various embodiments, the step 210 of manufacturing a GOI structure 110 may further include machining the germanium layer 115 on the insulating substrate 111.

According to various embodiments, the step 210 of manufacturing a GOI structure 110 may further include preparing an insulating substrate 111 comprising a base layer 112 and an oxide layer 113 overlying the base layer 112.

According to various embodiments, the bonding of the epitaxial wafer 310 onto the insulating substrate 111 may include integrating the oxide layer 113 on the germanium layer 115 with an oxide layer 113 of the insulating substrate 111.

According to various embodiments, at least one slot 121 configured to collect light from the light source element 130 may be formed in the germanium layer 115 in the waveguide region 120.

According to various embodiments, the light source element 130 may generate light so as to be coupled to the germanium layer 115 in the waveguide region 120.

According to various embodiments, the optical detection element 150 may be configured to convert the light from the waveguide region 120 into heat and detect the heat.

According to various embodiments, the step 220 of integrating the optical detection element 150 may include: forming an insulating layer 151 on one side of the waveguide region 120 so as to cover the germanium layer 115; stacking a bolometric material layer 153 on top of the insulating layer 151, whose resistance changes with heat generated as light is propagated from the germanium layer 115; and forming, on the bolometric material layer 153, at least one electrode 155 used to detect the resistance after a change in resistance has occurred.

According to various embodiments, the manufacturing method of the GOI device 100 may further include integrating a spectrometer 140 between the light source element 130 and the waveguide region 120 on the GOI structure 110, which is configured to decompose the light from the light source element 130 by wavelength and propagate it to the waveguide region 120.

The optical detection element 150 according to various embodiments may include: a GOI structure 110 comprising a germanium layer 115 configured to propagate light from the outside; and a bolometric material layer 153 disposed on the GOI structure 110, whose resistance changes with heat generated as light is propagated from the germanium layer 115; and configured to detect the resistance after a change in resistance has occurred.

According to various embodiments, the light may be mid-infrared light.

According to various embodiments, the optical detection element 150 may further include at least one of: an insulating layer 151 disposed between the germanium layer 115 and the bolometric material layer 153 and formed to cover the germanium layer 115; or at least one electrode 155 integrated on the bolometric material layer 153 and used to detect heat into which light is converted.

It should be appreciated that various embodiments of the disclosure and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. As used herein, singular forms may include plural forms as well unless the context clearly indicates otherwise. In the present disclosure, the expression "A or B", "at least one of A or/and B", or "one or more of A or/and B" may include all possible combinations of the items listed. The expression "a first", "a second", "the first", or "the second" may modify corresponding elements regardless of the order or importance, and is used only to distinguish one element from another element, but does not limit the corresponding elements. When an element (e.g., first element) is referred to as being "(physically or functionally) connected," or "coupled" to another element (second element), the element may be connected directly to the another element or connected to the another element through yet another element (e.g., third element).

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. A GOI (Ge-on-insulator) device for on-chip optical sensing, the GOI device comprising:
    a GOI structure with a waveguide region optical detection element comprising a germanium (Ge) layer;
    a light source element configured to generate light for the waveguide region; and
    at least one optical detection element configured to detect light coming from the waveguide region,
    wherein the optical detection element converts the light from the waveguide region into heat and detects the heat,
    wherein the GOI structure comprises:
        an insulating substrate; and
        a germanium layer integrated on the insulating substrate,
    wherein some part of the GOI structure is formed as the waveguide region, and
    wherein the optical detection element comprises:

an insulating layer integrated on one side of the waveguide region on the GOI structure and formed to cover the germanium layer on the insulating substrate;

a bolometric material layer stacked on top of the insulating layer, whose resistance changes with heat generated as light is propagated from the germanium layer; and at least one electrode integrated on the bolometric material layer and used to detect the resistance after a change in resistance has occurred.

2. The GOI device of claim 1, wherein the light generated from the light source element is mid-infrared light.

3. The GOI device of claim 1, wherein at least one slot configured to collect light from the light source element is formed in the germanium layer in the waveguide region.

4. The GOI device of claim 1, wherein the light source element generates light so as to be coupled to the germanium layer in the waveguide region.

5. The GOI device of claim 1, further comprising a spectrometer disposed between the light source element and the waveguide region and configured to decompose the light from the light source element by wavelength and propagate the decomposed light to the waveguide region.

6. A manufacturing method of a GOI (Ge-on-insulator) device for on-chip optical sensing, the method comprising:

manufacturing a GOI structure comprising a germanium layer and provided with a waveguide region;

integrating, on the GOI structure, a light source element configured to generate light for the waveguide region; and integrating, on the GOI structure, at least one optical detection element configured to detect light coming from the waveguide region, wherein the at least one optical detection element is configured to convert the light from the waveguide region into heat and detect the heat, and wherein the integrating of the optical detection element comprises:

forming an insulating layer on one side of the waveguide region so as to cover the germanium layer;

stacking a bolometric material layer on top of the insulating layer, whose resistance changes with heat generated as light is propagated from the germanium layer; and forming, on the bolometric material layer, at least one electrode used to detect the resistance after a change in resistance has occurred.

7. The method of claim 6, wherein the manufacturing of a GOI structure comprises:

preparing an epitaxial wafer with a germanium layer grown on a bottom layer;

forming an oxide layer on the germanium layer;

bonding the epitaxial wafer onto the insulating substrate through the oxide layer; and removing the bottom layer while leaving the germanium layer on the insulating substrate.

8. The method of claim 7, wherein the manufacturing of a GOI structure further comprises machining the germanium layer on the insulating substrate.

9. The method of claim 7, wherein the manufacturing of a GOI structure further comprises preparing an insulating substrate comprising a base layer and an oxide layer overlying the base layer, wherein the bonding of the epitaxial wafer onto the insulating substrate comprises integrating the oxide layer on the germanium layer with the oxide layer of the insulating substrate.

10. The method of claim 6, wherein at least one slot configured to collect light from the light source element is formed in the germanium layer in the waveguide region.

11. The method of claim 6, wherein the light source element generates light so as to be coupled to the germanium layer in the waveguide region.

12. The method of claim 6, further comprising integrating a spectrometer between the light source element and the waveguide region on the GOI structure, which is configured to decompose the light from the light source element by wavelength and propagate the decomposed light to the waveguide region.

13. An optical detection element for on-chip optical sensing comprising:

a GOI (Ge-on-insulator) structure comprising a germanium layer configured to propagate light from the outside; and a bolometric material layer disposed on the GOI structure, whose resistance changes with heat generated as light is propagated from the germanium layer, and configured to detect the resistance after a change in resistance has occurred.

14. The optical detection element of claim 13, wherein the light is mid-infrared light.

15. The optical detection element of claim 13, further comprising at least one of:

an insulating layer disposed between the germanium layer and the bolometric material layer and formed to cover the germanium layer; or at least one electrode integrated on the bolometric material layer and used to detect heat into which light is converted.

* * * * *